United States Patent [19]

Lee

[11] Patent Number: 5,301,159
[45] Date of Patent: Apr. 5, 1994

[54] ANTI-FUSE CIRCUIT AND METHOD WHEREIN THE READ OPERATION AND PROGRAMMING OPERATION ARE REVERSED

[75] Inventor: Roger R. Lee, Boise, Id.

[73] Assignee: Micron Technology, Inc., Boise, Id.

[21] Appl. No.: 13,896

[22] Filed: Feb. 5, 1993

[51] Int. Cl.$^5$ .............................. G11C 17/00
[52] U.S. Cl. .................. 365/225.7; 365/96; 257/50; 257/530
[58] Field of Search ............... 365/96, 225.7; 257/50, 257/530

[56] References Cited

U.S. PATENT DOCUMENTS

| | | | |
|---|---|---|---|
| 4,943,538 | 7/1990 | Mohsen et al. | 437/52 |
| 5,008,855 | 4/1991 | Eltoukhy et al. | 365/96 |
| 5,119,163 | 6/1992 | Ishihara et al. | 257/530 |
| 5,148,391 | 9/1992 | Zagar | 365/102 |
| 5,241,496 | 4/1993 | Lowrey et al. | 365/94 |

Primary Examiner—Eugene R. LaRoche
Assistant Examiner—Tan Nguyen
Attorney, Agent, or Firm—Susan B. Collier

[57] ABSTRACT

The invention features a circuit wherein a serially connected transistor and anti-fuse element are biased for current to flow in a first direction or the current flows in the first direction during a programming operation and biased for a current to flow in a second direction or current is flowing in the second direction during a normal circuit operation, such as a read operation, wherein the first and second directions are opposite of one another. Thus the invention facilitates the use of a low programming potential while minimizing leakage current.

20 Claims, 2 Drawing Sheets

ANTI-FUSE CIRCUIT AND METHOD WHEREIN THE READ OPERATION AND PROGRAMMING OPERATION ARE REVERSED

FIELD OF THE INVENTION

The invention relates to the field of integrated electronic circuit technology. More particularly, the invention relates to a reliable anti-fuse element to be used in integrated circuits.

BACKGROUND OF THE INVENTION

Integrated electronic circuits are usually made with all internal connections set during the manufacturing process. However, because of high development costs, long lead times, and high manufacturing tooling costs of such circuits, users often desire circuits which can be configured or programmed in the field. Such circuits are called field programmable circuits and they can contain programmable links. Programmable links are electrical interconnects which are either broken or created at selected electronic nodes by the user after the integrated device has been fabricated and packaged in order to activate or deactivate the selected electronic nodes.

Programmable links have been used extensively in programmable read only memory (PROM) devices. Probably the most common form of programmable link is a fusible link. When a user receives a PROM device from a manufacturer, it usually consists of an X-Y matrix or lattice of conductors or semiconductors. At each cross-over point of the lattice a conducting link, call a fusible link, connects a transistor or other electronic node to this lattice network. The PROM is programmed by blowing the fusible links to selected nodes and creating an open circuit. The combination of blown and unblown links represents a digital bit pattern of ones and zeros signifying data which the user wishes to store in the PROM. By providing an address the data stored on a node may be retrieved during a read operation.

In recent years, a second type of programmable link, call an anti-fuse link, has been developed for use in integrated circuit applications. Instead of the programming mechanism causing an open circuit as in the case with fusible links, the programming mechanism in an anti-fuse circuit creates a short circuit or relatively low resistance link. Thus the anti-fuse link presents an open circuit prior to programming and a low resistance connection after programming. Anti-fuse links consist of two electrodes comprised of conductive and/or semiconductive materials and having some kind of a dielectric or insulating material between them. During programming, the dielectric at selected points in between the conductive materials is broken down by predetermined applied voltages, thereby electrically connecting the conducting and/or semiconducting materials together.

A plurality of such anti-fuses may be disposed in a semiconductor integrated circuit, and may be selectively blown to create low impedance interconnects at selected locations within the integrated circuit. The anti-fuses may be blown either before or after packaging of the integrated circuit die.

Critical issues facing the designer of the anti-fuse device is the capability to program the device using a low potential while minimizing leakage currents. The two basic circuit configurations for the anti-fuse element are shown in FIGS. 1 and 2. In both configurations a transistor is serially connected to the anti-fuse element. In the configuration shown in FIG. 1, the anti-fuse 5 is connected to a reference potential and the transistor 10 is connected to a supply potential. There is a transistor source bias associated with this approach which requires a higher supply potential than would be required if there were no transistor source bias. In the configuration shown in FIG. 2, the anti-fuse 15 is connected to a supply potential and the transistor 20 is connected to a reference potential. The circuit of FIG. 2 is much easier to program than the circuit of FIG. 1 due to the elimination of the transistor source bias associated with the approach depicted in FIG. 1. Elimination of the source bias allows the anti-fuse element to be programmed using a lower potential. However, it has been observed that leakage current is increased between the supply potential at supply node 25 and the reference potential at reference node 30, and/or that leakage current is increased between supply node 25 and the substrate. This leakage is not desirable in the programmable circuit for it increases the standby current.

Post program transistor current-voltage curves are shown in FIG. 3. The drain voltage has been increased from 0 V to 5 V in 1 volt increments with the resultant drain current measured and plotted at each increment. The solid lines represent the data plotted for FIG. 2 and the dashed lines represent the data plotted for FIG. 1. The curves have been lettered. The solid lines are represented by a letter having no prime symbol and the dashed lines are represented by a letter having a prime signal. Each of the curves having corresponding letters have the same gate voltage. For example F and F' had a gate voltage of 0 V. It can be clearly seen that when the supply node 25 is the drain of the transistor, as shown in FIG. 2, the leakage current for $V_g=0$ is too large for the transistor to handle, see curve F. Conversely, if we were to use reference node 35 as the transistor source and the supply node 40 as the transistor drain, as shown in FIG. 1, the transistor leakage at $V_g=0$ is much lower, see curve F'. However as was discussed earlier, the configuration of FIG. 1 has a transistor source bias which requires a higher supply potential than the circuit of FIG. 2. Therefore a need exists to minimize leakage current while providing a low programming potential.

SUMMARY OF THE INVENTION

The object of the invention is to provide a low programming potential while reducing leakage current. The invention features a circuit wherein a serially connected transistor and anti-fuse element are biased for current to flow in a first direction or the current flows in the first direction during a programming operation and biased for a current to flow in a second direction or current is flowing in the second direction during a normal circuit operation, such as a read operation, wherein the first and second directions are opposite of one another. Thus the invention facilitates the use of a low programming potential while minimizing post programming leakage current.

Due to the low programming potential requirement of the invention, memory devices comprising the anti-fuse elements of the invention are successfully programmed using batteries as a power source. Direct consequences of the successful programming using batteries are good post program current-voltage characteristics.

DETAILED DESCRIPTION OF THE INVENTION

Figure 1:
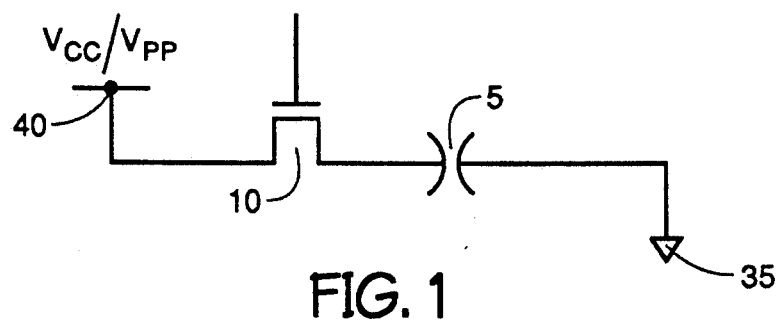
FIG. 1 depicts a circuit of the related art.
Figure 2:
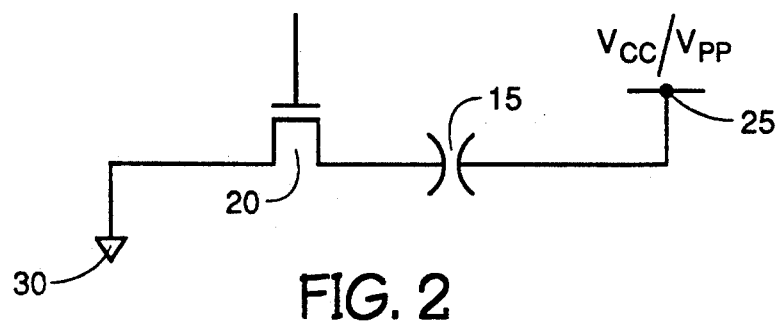
FIG. 2 depicts a circuit of the related art.
Figure 4:
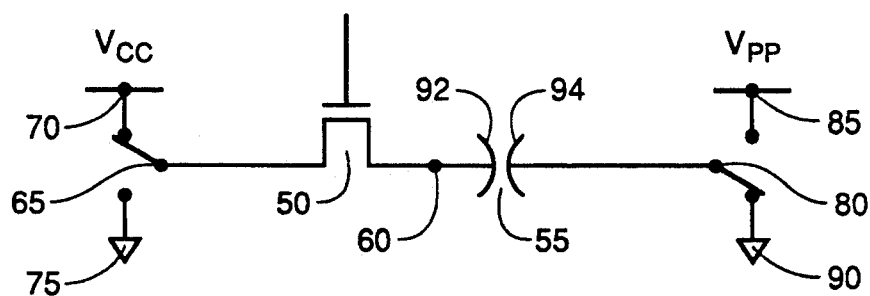
FIG. 4 depicts the circuit of the invention.
Figure 3:
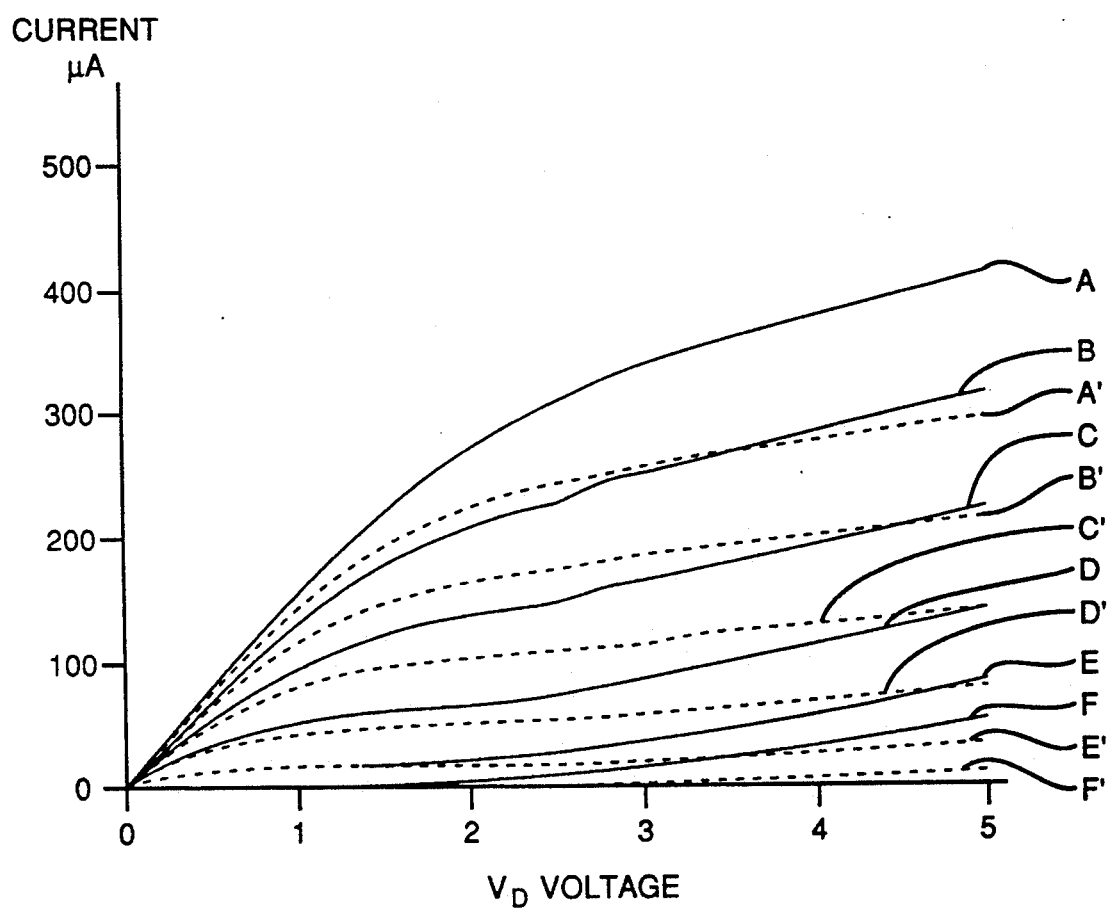
FIG. 3 three shows the transistor current and drain voltage curves of the circuits of Figures one and two.

FIG. 4 depicts the circuit of the invention. An n-channel metal oxide semiconductor (NMOS) transistor 50 and an anti-fuse element 55 are serially connected at serial node 60. The source/drain connection 65 of the transistor 50 has the capability of being electrically connected to a normal operation supply potential, $V_{cc}$, at normal supply node 70 or connected to a reference potential at reference node 75. Similarly terminal 80 of the anti-fuse device has the capability of being electrically connected to either a programming supply potential, $V_{pp}$, at programming supply node 85 or connected to the reference potential at reference node 90. A typical reference potential is ground or zero volts. A typical normal operation supply potential is 5 volts or 3.3 volts, and a typical programming supply potential ranges between 10 and 12 volts. However it is conceivable that the supply potentials at nodes 70 and 85 may have the same value, and it is conceivable that the reference potentials at nodes 75 and 90 may have different values. The switching of source/drain connection 65 and terminal 80 between the supply and reference potentials may be controlled by external programming signals or by internal programming signals. A combination of external and internal signals may control the switching of source/drain connection 65 and terminal 80.

During a programming operation, the dielectric of a selected anti-fuse device is broken down. This breakdown results when the circuit is biased to produce a current flow through the anti-fuse device. The current flow causes the dielectric to weaken which in turn results in an electrical connection between first and second conductive plates of the anti-fuse device. When terminal 80 is connected to the programming supply potential at programming supply node 85, and source/drain connection 65 is connected to the reference potential at reference node 75 a first potential bias is applied across the circuit. The circuit is programmed when the first potential bias is applied. By connecting source/drain connection 65 and terminal 80 in this manner the first potential bias has a polarity which eliminates the transistor source bias during the programming operation, and current can flow in a first direction. If transistor 50 is actuated the dielectric in the antifuse is broken down and current flows in the first direction.

By biasing the circuit with a second potential bias during a normal circuit operation, such as a read operation, with a polarity opposite the polarity of the first potential bias applied during the programming operation, leakage current is minimized. The second potential bias is applied to the circuit when terminal 80 is connected to the reference potential at reference node 90 and source/drain connection 65 is connected to the normal operation supply potential at normal supply node 70. By connecting source/drain connection 65 and terminal 80 in this manner the second potential bias has a polarity which can cause current flow or current does flow in a second direction, depending upon the state of the anti-fuse element. That is, if the anti-fuse element has been broken down current can flow through the element in the second direction, and if the anti-fuse element has not been broken down the circuit is biased such that current would flow in the second direction if it were possible. The first and second directions are opposite of one another.

Thus the circuit and method of the invention reverses the polarity of the potential bias applied across the serially connected transistor and anti-fuse device during programming and the polarity of the potential bias applied across the serially connected transistor and anti-fuse device during a normal operation. Thus the invention facilitates the use of a low supply potential to program the device while minimizing leakage current. It is conceivable that in the actual circuit design supply nodes 70 and 85 are the same circuit point, and that reference nodes 75 and 90 are the same circuit point.

Although the circuit and method of the invention have been described in terms of an anti-fuse device the invention has utility in any circuit wherein the direction of the potential bias across the circuit is reversed in order to perform different functions. Modification to the circuitry may also be implemented without detracting from the concept of the invention. Accordingly, the invention should be read as limited only by the claims.

What is claimed is:

1. A semiconductor memory device having a circuit for minimizing leakage current comprising an anti-fuse element wherein the anti-fuse element is biased for a current to flow in a first direction or the current is flowing in said first direction during a first operation of the memory circuit, and said anti-fuse element is biased for current to flow in a second direction or the current flows in said second direction during a second operation of the memory circuit, said first and second directions being opposite of one another.

2. The memory device as specified in claim 1, wherein said first operation is a programmable operation, and wherein said second operation is a read operation.

3. The memory device as specified in claim 1, wherein a resistance of said anti-fuse element is reduced when the current initially flows through the anti-fuse element.

4. A memory device, comprising:
 a) a serial device, having a first terminal and a second terminal;
 b) a first conductive plate in electrical communication with said first terminal of said serial device;
 c) a second conductive plate;
 d) a dielectric layer interposed between said first and said second conductive plates, said dielectric layer capable of electrically isolating said first and second conductive plates one from the other; and
 e) a control means for connecting a first and second potential bias across said second terminal of said serial device and said second conductive plate, said first potential bias capable of effecting a reduction in a resistance of said dielectric layer, said reduction in said resistance providing an electrical connection between said first and second conductive plates, said first and second biases being opposite of one another such that a current would flow in a first direction in response to said first potential bias and the current would flow in a second direction in response to said second potential bias, said first and second directions being opposite of one another.

5. The memory device as specified in claim 4, wherein said first potential bias is capable of producing a breakdown current flowing in said first direction, said breakdown current breaking down said dielectric layer thereby effecting said reduction in said resistance of said dielectric layer.

6. A programmable memory circuit, comprising:
a) a control device having a first terminal and a second terminal;
b) an anti-fuse element having a first conductive plate and a second conductive plate and a dielectric layer, said dielectric layer electrically interposed between and capable of electrically isolating said first and second conductive plates one from the other, said first conductive plate of said anti-fuse element in electrical communication with the first terminal of said control device;
c) a first electrical configuration wherein said second terminal of said control device is connectable to a first potential source and said second conductive plate is connectable to a second potential source; and
d) a second electrical configuration wherein said second terminal of said control device is connectable to a third potential source and said second conductive plate is connectable to a fourth potential source.

7. The programmable memory circuit as specified in claim 6, wherein said control device and said anti-fuse element form a serial circuit, and wherein when said serial circuit is connected in said first electrical configuration said serial circuit is biased for a current to flow in a first direction or the current is flowing in said first direction, and wherein when said serial circuit is connected in said second electrical configuration said serial circuit is biased for the current to flow in a second direction or the current is flowing in said second direction, said first and second directions being opposite of one another.

8. The programmable memory circuit as specified in claim 6, wherein said first potential source and said fourth potential source provide substantially equivalent potential values.

9. The programmable memory circuit as specified in claim 6, wherein said third potential source and said second potential source provide substantially equivalent potential values.

10. The programmable memory circuit as specified in claim 6, wherein the circuit is configured according to said first electrical configuration for a normal operation of the programmable memory circuit and wherein the circuit is configured according to said second electrical configuration for a programming operation of the programmable memory circuit.

11. A circuit for programming a programmable node, comprising:
a) a programmable device having first and second conductive terminals interposed by a programmable layer, said programmable device in electrical communication with and interposed between the programmable node and a first node, said first node alternately connectable to a first potential and a second potential;
b) a series device in electrical communication with and interposed between said programmable node and a second node, said second node alternately connectable to a third and a fourth potential; and
c) the programmable node capable of having a first programmable potential when said programmable layer electrically isolates said first and second conductive terminals, the programmable node capable of having a second programmable potential subsequent to a breakdown of said programmable layer by a programmable current flow in a first direction resulting from said first and third potentials at said first and second nodes respectively, a value of said first and second programmable potentials of said programmable node available when said first and second nodes are electrically connected to second and fourth potentials respectively.

12. The circuit as specified in claim 11, wherein said second and fourth potentials on said first and second nodes provides a bias potential between said first and second node which could cause current to flow in a second direction, said first and second directions being opposite one to the other.

13. A method of operating a memory device having a plurality of programmable nodes, each one of said plurality in electrical communication with a respective one of a plurality of first conductive plates, each first conductive plate having a corresponding second conductive plate, comprising:
a) determining which of said programmable nodes of said plurality are selected and which are non-selected;
b) electrically insulating said first conductive plate from said corresponding second conductive plate for said first conductive plates in electrical communication with non-selected said programmable nodes;
c) applying a first potential bias across said first and said corresponding second conductive plates for said first conductive plates in electrical communication with selected said programmable nodes;
d) providing, in response to said step of applying said first potential bias, electrical communication between said first and said second corresponding conductive plates for said first conductive plates in electrical communication with selected said programmable nodes; and
e) applying a second potential bias across a circuit having an addressed one of said programmable nodes of said plurality in order to perform a circuit function, said first potential bias and said second potential bias having opposite polarities such that electrical current would flow or current flows in opposite directions in response to said first potential bias and in response to said second potential bias.

14. The method as specified in claim 13, further comprising breaking down said dielectric layer interposed between said first and second conductive plates due to an electrical current flowing between said first and second conductive plates, said current flow generated in response to said step of applying said first potential bias.

15. A method of operating a programmable memory device having an anti-fuse element, comprising:
a) applying a first potential wherein the anti-fuse element is biased for a first current to flow in a first direction or the first current is flowing in said first direction during a first operation of said programmable memory device; and b) applying a second potential bias wherein said anti-fuse element is biased for a second current to flow in a second direction or the second current flows in said second direction during a second operation of said programmable memory device, said first and second directions being opposite of one another.

16. A method for programming a node in electrical communication with an anti-fuse device, comprising:
   a) substantially prohibiting current flow between a first conductive surface and a second conductive surface of said anti-fuse device when said node is non-selected;
   b) electrically connecting said node to said second conductive surface when said node is selected, said electrically connecting performed in response to a first current flow, having a first direction, between said first and second conductive surfaces; and
   c) providing a bias across a circuit containing said node and said anti-fuse device, such that a second current would flow in a second direction or the second current flows in said second direction between said first and said second conductive surfaces, said first and second directions being opposite of one another.

17. The method as specified in claim 16, wherein said step of providing is performed for a read operation.

18. On a monolithic integrated circuit device, a sub-circuit for minimizing leakage current comprising an anti-fuse element wherein the anti-fuse element is biased for a current to flow in a first direction or the current is flowing in said first direction during a first operation of the sub-circuit, and said anti-fuse element is biased for current to flow in a second direction or the current flows in said second direction during a second operation of the sub-circuit, said first and second directions being opposite of 19. The sub-circuit as specified in claim 18, wherein said first operation is a programmable operation, and wherein said second operation is a read operation.

20. The sub-circuit as specified in claim 18, wherein a resistance of said anti-fuse element is reduced when the current initially flows through the anti-fuse element.

* * * * *